United States Patent
Hsieh et al.

(10) Patent No.: US 8,806,391 B2
(45) Date of Patent: Aug. 12, 2014

(54) METHOD OF OPTICAL PROXIMITY CORRECTION ACCORDING TO COMPLEXITY OF MASK PATTERN

(75) Inventors: Te-Hsien Hsieh, Kaoshiung (TW); Ming-Jui Chen, Hsinchu (TW); Cheng-Te Wang, Hsinchu County (TW); Shih-Ming Kuo, Tainan (TW); Jing-Yi Lee, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 18 days.

(21) Appl. No.: 13/563,684

(22) Filed: Jul. 31, 2012

(65) Prior Publication Data

US 2014/0040837 A1 Feb. 6, 2014

(51) Int. Cl.
*G06F 17/50* (2006.01)

(52) U.S. Cl.
USPC .................................. 716/53; 716/52; 716/54

(58) Field of Classification Search
USPC ....................................................... 716/52–54
See application file for complete search history.

(56) References Cited

U.S. PATENT DOCUMENTS

| | | | |
|---|---|---|---|
| 6,033,811 A | 3/2000 | Lee | |
| 6,245,468 B1 * | 6/2001 | Futrell et al. | 430/5 |
| 6,395,438 B1 | 5/2002 | Bruce | |
| 6,470,489 B1 | 10/2002 | Chang | |
| 6,523,162 B1 * | 2/2003 | Agrawal et al. | 716/53 |
| 6,667,136 B2 * | 12/2003 | Bula et al. | 430/5 |
| 6,684,382 B2 | 1/2004 | Liu | |
| 6,753,115 B2 | 6/2004 | Zhang | |
| 6,763,514 B2 | 7/2004 | Zhang | |
| 6,852,453 B2 | 2/2005 | Wu | |
| 6,931,613 B2 | 8/2005 | Kauth | |
| 6,961,920 B2 | 11/2005 | Zach | |
| 6,964,032 B2 * | 11/2005 | Liebmann et al. | 716/53 |
| 7,115,343 B2 * | 10/2006 | Gordon et al. | 430/5 |
| 7,172,838 B2 | 2/2007 | Maurer | |
| 7,233,887 B2 * | 6/2007 | Smith | 703/2 |
| 7,353,145 B2 * | 4/2008 | Tanaka et al. | 703/2 |
| 7,386,829 B2 | 6/2008 | Lee | |
| 7,624,369 B2 | 11/2009 | Graur | |
| 7,650,587 B2 * | 1/2010 | Baum et al. | 716/54 |
| 7,739,650 B2 * | 6/2010 | Torres Robles et al. | 716/50 |
| 7,824,826 B2 * | 11/2010 | Hsu et al. | 430/5 |
| 7,882,480 B2 * | 2/2011 | Ye et al. | 716/53 |
| 7,886,262 B2 * | 2/2011 | Chew et al. | 716/132 |
| 7,981,576 B2 * | 7/2011 | Hsu et al. | 430/5 |
| 7,987,435 B2 * | 7/2011 | Ogawa et al. | 716/51 |
| 8,103,995 B2 * | 1/2012 | Wang | 716/100 |
| 8,122,387 B2 * | 2/2012 | Han et al. | 716/50 |
| 8,321,818 B2 * | 11/2012 | Agarwal et al. | 716/53 |
| 8,336,003 B2 * | 12/2012 | Cheng et al. | 716/53 |
| 8,336,006 B2 * | 12/2012 | Kodera et al. | 716/55 |
| 8,464,193 B1 * | 6/2013 | Barai | 716/110 |
| 8,614,034 B2 * | 12/2013 | Moon et al. | 430/5 |

(Continued)

*Primary Examiner* — Naum Levin
(74) *Attorney, Agent, or Firm* — Winston Hsu; Scott Margo

(57) ABSTRACT

A method of optical proximity correction (OPC) includes the following steps. At first, a layout pattern is provided to a computer system. Subsequently, the layout pattern is classified into at least a first region and at least a second region. Then, several iterations of OPC calculations are performed to the layout pattern, and a total number of OPC calculations performed in the first region is substantially larger than a total number of OPC calculations performed in the second region. Afterwards, a corrected layout pattern is outputted through the computer system onto a mask.

14 Claims, 5 Drawing Sheets

(56) References Cited

U.S. PATENT DOCUMENTS

| | | | |
|---|---|---|---|
| 2005/0229130 A1* | 10/2005 | Wu et al. .......................... 716/8 |
| 2005/0251771 A1 | 11/2005 | Robles |
| 2006/0066339 A1 | 3/2006 | Rajski |
| 2006/0085772 A1 | 4/2006 | Zhang |
| 2006/0161452 A1 | 7/2006 | Hess |
| 2007/0162887 A1* | 7/2007 | Suh et al. ....................... 716/21 |
| 2009/0193385 A1 | 7/2009 | Yang |
| 2009/0278569 A1 | 11/2009 | Taoka |
| 2009/0300576 A1 | 12/2009 | Huang |
| 2010/0036644 A1 | 2/2010 | Yang |
| 2010/0070944 A1 | 3/2010 | Wu |
| 2010/0086862 A1 | 4/2010 | Yang |
| 2010/0131914 A1 | 5/2010 | Wu |
| 2010/0175041 A1 | 7/2010 | Krasnoperova |
| 2010/0185998 A1* | 7/2010 | Wang .............................. 716/19 |
| 2010/0318956 A1* | 12/2010 | Han et al. ...................... 716/136 |
| 2010/0333049 A1* | 12/2010 | Agarwal et al. ................. 716/55 |
| 2011/0029939 A1 | 2/2011 | Yang |
| 2011/0139027 A1* | 6/2011 | Hansen ...................... 101/450.1 |
| 2011/0173578 A1* | 7/2011 | Tsai et al. ....................... 716/55 |
| 2011/0209106 A1* | 8/2011 | Cheng et al. ................... 716/55 |

\* cited by examiner

METHOD OF OPTICAL PROXIMITY CORRECTION ACCORDING TO COMPLEXITY OF MASK PATTERN

BACKGROUND OF THE INVENTION

1. Field of the Invention

The present invention relates to a method of optical proximity correction (OPC), and more particularly, to a method of OPC having a variable number of implemented OPC calculations according to the complexity of mask pattern.

2. Description of the Prior Art

With the trend of miniaturization of the electronic products and peripherals, research about thin structures and high integration of the semiconductor devices have become the essential subjects and developing aspects in the industry, and the lithography technology plays an important role to determine the performances of the semiconductor devices.

In semiconductor manufacturing processes, the integrated circuit layout is first designed and formed as a mask pattern. The mask pattern is then proportionally transferred to a photoresist layer disposed on the semiconductor wafer through an exposure process followed by a development process. Subsequently, a corresponding etching process is performed in order to manufacture the semiconductor devices on the semiconductor wafer. With the demand of increasing integration and decreasing size of semiconductor devices, the critical dimension (CD) of each segment fabricated through exposures is limited to the resolution limit of the optical exposure tool used for transferring the mask pattern. A problem that easily arises during the exposures of a mask pattern with high-density arranged segments to form a pattern on a photoresist is the optical proximity effect. Such a resolution loss occurs because of overexposure or underexposure, which brings a deviation of the pattern on the photoresist layer from the original mask pattern. Many saving methods have been used to avoid the deviation caused by the optical proximity effect in order to improve the quality of the transferred pattern. The most popular method is the optical proximity correction (OPC). And there is a variety of commercial optical proximity correction software that can theoretically correct the mask patterns to be more accurately transferred on a wafer.

A mask pattern corrected by the optical proximity correction method must be inspected by a process rule check (PRC) to confirm the correctness of the mask pattern. The process rule check inspects line ends and corners of each segment of a mask pattern to verify that if those geometrical patterns obey the limitation of the critical width and the critical space of the designed integrated circuit layout. If the corrected mask pattern completely obeys the rules of the process rule check, the mask pattern is then outputted and provided to the lithography process. Conversely, if a part of, or all portions of the mask pattern violates the rules of process rule check, the mask pattern needs to be re-modified.

In the conventional method of optical proximity correction, each optical proximity correction would modify the mask pattern based on the previous result of process rule check. In other words, a mask pattern would be corrected with repeated steps of optical proximity correction and process rule check. Therefore, the output of a mask pattern is delayed, and the loading of computer resources is also increased. Consequently, how to improve the method of optical proximity correction to form the needed mask pattern quicker, to lower the loading of computer system, and to reduce the manufacturing cost of mask, is still an important issue in the field.

SUMMARY OF THE INVENTION

An objective of the present invention is therefore to provide a method of optical proximity correction (OPC) in order to save time for correcting mask patterns.

According to one exemplary embodiment of the present invention, a method of optical proximity correction (OPC) includes the following steps. At first, a layout pattern is provided to a computer system. Subsequently, the layout pattern is classified into at least a first region and at least a second region. Then, several iterated OPC calculations are performed to the layout pattern, and a total number of OPC calculations performed in the first region is substantially larger than a total number of OPC calculations performed in the second region. Afterwards, a corrected layout pattern is outputted through the computer system onto a mask.

The characteristic of the present invention is illustrated below. The layout pattern may be first classified into the first region and the second region according to the pattern density or the complexity of each of the patterns. The pattern density of the first region is high (or the patterns of the first region are hardly recognized), and the pattern density of the second region is low (or the patterns of the second region are easily recognized), therefore, the estimated time used to complete the correction of patterns of the first region would be longer than that used to complete the correction of the patterns of the second region. Then, several iterations of OPC calculations are performed on the layout pattern, and at least one OPC calculation is only performed on the layout pattern of the first region and the correction of the layout pattern of the second region is skipped. Accordingly, the loading of computer system can be lowered, and the time to complete the correction of the patterns can be shortened, moreover, if a portion of the mask pattern violates the rules of process rule check, the mask pattern could be partially re-modified, and the manufacturing costs of mask can be reduced.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
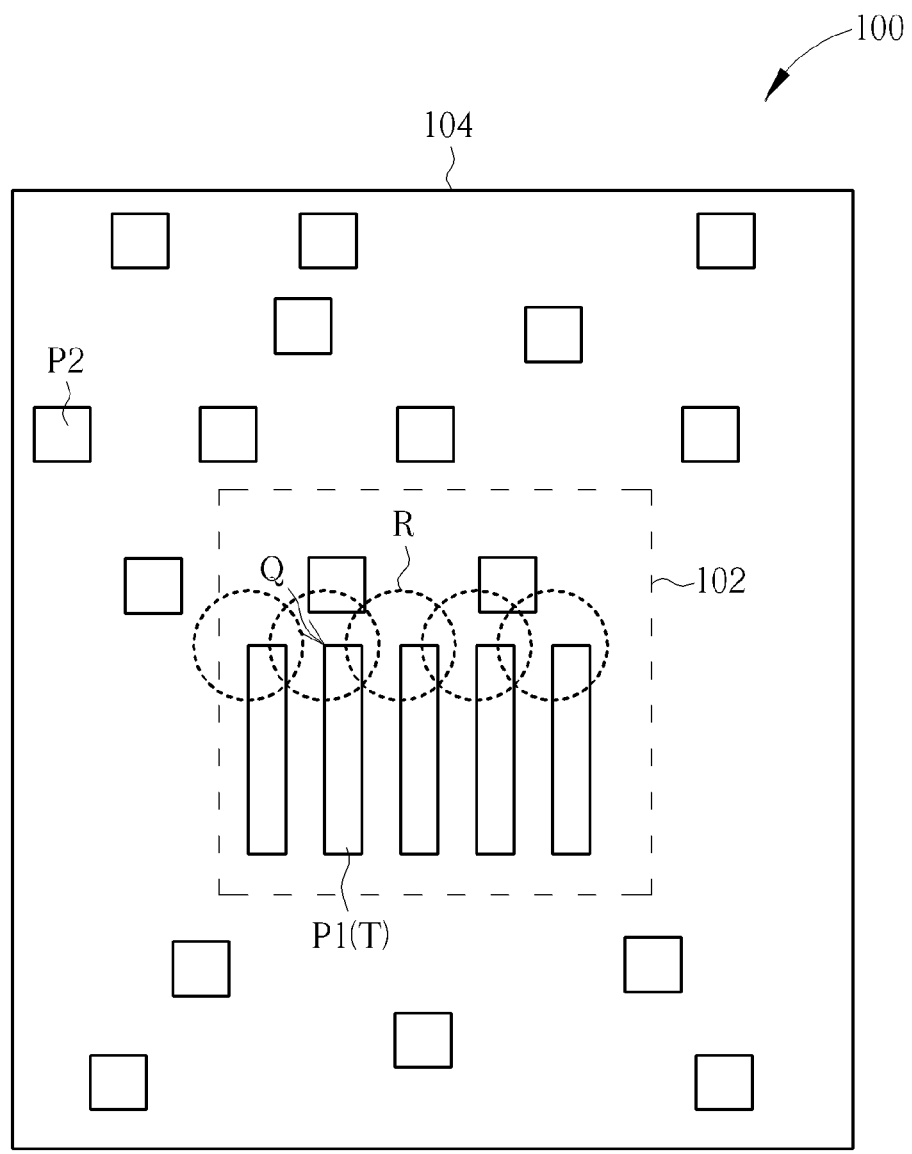
FIG. 1 through FIG. 4 are schematic diagrams illustrating a method of optical proximity correction (OPC) according to a preferred exemplary embodiment of the present invention.

The present invention provides a method of optical proximity correction (OPC). Please refer to FIG. 1 through FIG. 4, which are schematic diagrams illustrating a method of optical proximity correction (OPC) according to a preferred exemplary embodiment of the present invention. As shown in FIG. 1, a layout pattern 100 is provided to a database of a computer system (not shown), and the computer system is used to classify the layout pattern 100 into at least a first region 102 and at least a second region 104. The layout pattern 100 which is an ideal pattern supposed to be later transferred on a mask or a photoresist layer (not shown) on a wafer may include feature patterns used to construct integrated circuit (IC) such as doped region patterns, device patterns, or layout of circuits. In this exemplary embodiment, the layout pattern 100 includes a plurality of geometric patterns P1/P2 such as strip patterns and square patterns etc.

Furthermore, the method for classifying the layout pattern into the first region and the second region includes the following steps. At first, the layout pattern 100 could be formed on a test mask and a lithography process is further performed to transfer the layout pattern 100 onto the photoresist layer, and this step could also be performed through a simulation model. Then, a specific software is used to collect the parameters of each of the geometric patterns P1/P2, the parameters include a value of mask error enhancement factor (MEEF), a value of normalized image log slope (NILS) and a value of contrast (Contrast). Subsequently, these parameters are applied in a formula, so that each of the geometric patterns P1/P2 may have a judgment value. The formula could be expressed as a function, for example, D=f (MEEF, NILS, Contrast), D represents the judgment value, and f represents the function of formula. The judgment value D can be refereed to evaluate if each of the geometric patterns P1/P2 is easy to be corrected into a pattern able to be later transferred onto the mask. The bigger the judgment value D is, the more difficult it is to correct the geometric pattern P1/P2, i.e. longer time is needed to complete the correction of the geometric pattern P1/P2. In other words, the geometric pattern P1/P2 may have a complex contour, a small line width, or a small interval between itself and the neighboring geometric patterns. In this exemplary embodiment, the geometric pattern P1 is a pattern difficult to be corrected, and the geometric pattern P2 is a pattern easy to be corrected, but not limited thereto.

More specifically, the MEEF corresponds to the ratio of the deviation of patterns on the photoresist layer on the wafer to the deviation of patterns on the mask. For example, as the MEEF of the pattern gets larger, the same deviation of pattern on the mask may cause more deviation of pattern on the photoresist layer on the wafer, therefore, more precision in pattern correction is required. Accordingly, the judgment value D is positively corresponding to a value of MEEF, and the coefficient of the MEEF in the illustrated formula is preferably a positive number. When the light passes through the mask patterns, the NILS corresponds to the slope of the light intensity at the edge of the mask pattern, and the Contrast corresponds to a ratio of the light intensity at the brightest part to the light intensity at the darkest part. As the NILS and/or the Contrast of the patterns get larger, the quality of the transferred patterns on the photoresist layer on the wafer gets better, and a pattern correction is therefore not so necessary. Accordingly, the judgment value D is negatively corresponding to the value of the NILS and the Contrast, and the coefficients of the NILS and of the Contrast in the illustrated formula are preferably a negative number.

Subsequently, the judgment value D of each of the geometric patterns P1/P2 is compared with a cut-off value, and each of the geometric patterns P1/P2 having the judgment value D substantially larger than the cut-off value can be defined as a target pattern. In this exemplary embodiment, each of the geometric patterns P1 is defined as a target pattern T. Furthermore, the cut-off value may be an unfixed value according to process conditions, such as pattern density of the layout pattern, type of the light source, or structure of the light source. Furthermore, the target pattern T is taken as a reference point, and a specific region R is selected. The geometric patterns P1/P2 contacted by the specific region R are all defined as the layout pattern of the first region 102. More specifically, in this exemplary embodiment, a terminal Q of each of the target patterns T may serve as a center, and a specific value is set as radius, for example, the specific value could be 1 micrometer (μm), therefore, each of the target pattern T may respectively be used to define a circular region as a specific region R. The geometric patterns P1/P2 contacted by each of the specific regions R are defined as the layout pattern of the first region 102, in other words, the layout pattern of the first region 102 is the sum of the patterns contacted by each of the circular regions, i.e. specific regions R. Additionally, the remaining layout pattern, i.e. the layout pattern outside the first region 102, can be defined as the layout pattern of the second region 104. In this exemplary embodiment, the area of the layout pattern of the first region 102 is substantially around 20% of the total area of the original layout pattern 100, and the area of the layout pattern of the second region 104 is substantially around 80% of the total area of the original layout pattern 100. Accordingly, the method of classifying the layout pattern 100 into the first region 102 and the second region 104 is completed herein.

Figure 2:
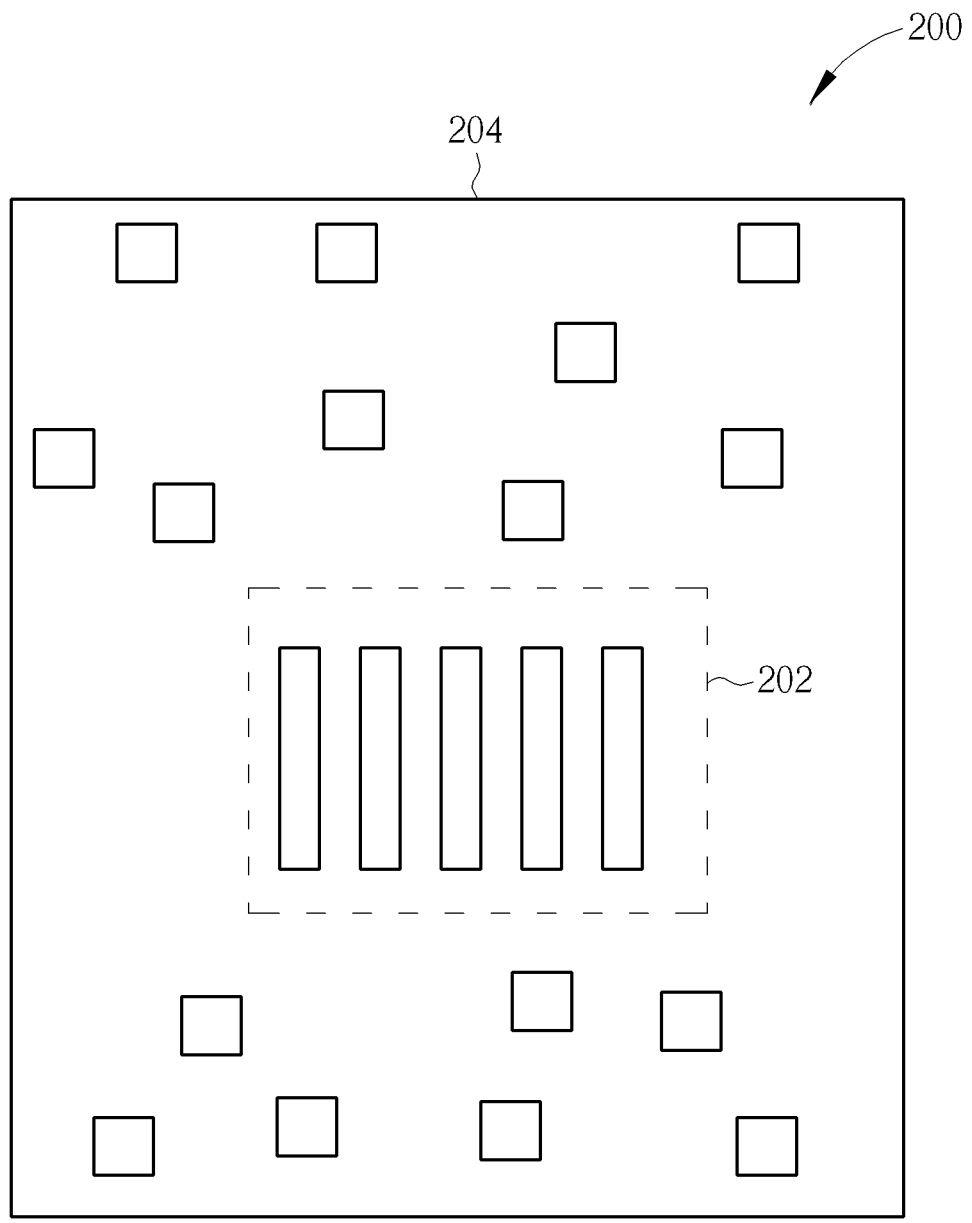

The method of classifying the layout pattern 100 into the first region 102 and the second region 104 is not limited as illustrated above, it may include the following steps. As shown in FIG. 2, a part of the layout pattern 200 is first selected according to the pattern density to be defined as the layout pattern of the first region 202, and the remaining layout pattern is defined as the layout pattern of the second region 204. The layout pattern 200 includes rectangular patterns or strip patterns, but not limited thereto. Additionally, the dense region including more patterns per unit area can be defined as the first region 202, and the isolated region including less patterns per unit area can be defined as the second region 204, i.e. a pattern density of the layout pattern of the first region 202 is substantially larger than a pattern density of the layout pattern of the second region 204. The distance between two neighboring patterns in the first region 202 is smaller than the distance between two neighboring patterns in the second region 204, therefore, the time used to complete the correction of the layout pattern of the first region 202 would be generally longer than that used to complete the correction of the layout pattern of the second region 204.

After the classification of the layout pattern, several iterations of OPC calculations are further performed to the layout pattern. The OPC calculation includes the following steps. The line width, pattern density and the relative position of each of the geometric patterns P1/P2 of the layout pattern 100 are first collected and further compared with the correction standard in the data base. Subsequently, the correction value of each of the geometric patterns P1/P2 can be calculated to correct the line width, the line end or the corner of the line segment of each of the geometric patterns P1/P2. The usual way of correcting the patterns includes the adjustment of the line width of the line segment, and the disposition of assist patterns such as serif or hammerhead patterns at the line end or the corner, which may avoid the deviation of the transferred patterns, such as rounded right-angle corners, shortened line-ends, or increasing/decreasing of the line widths when the mask patterns are transferred to the photoresist layer.

Figure 3:
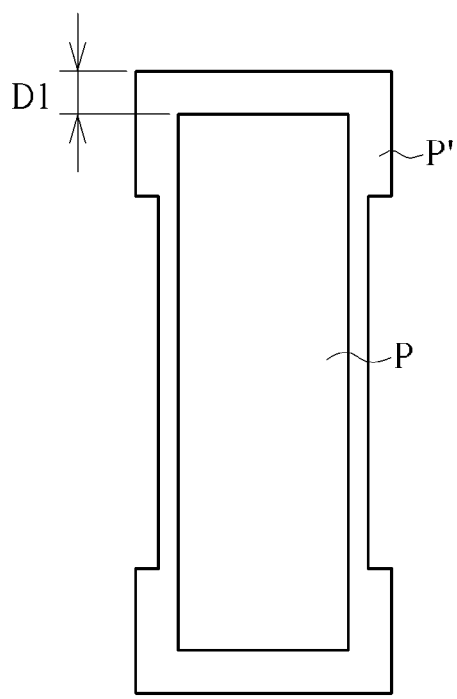
Figure 4:
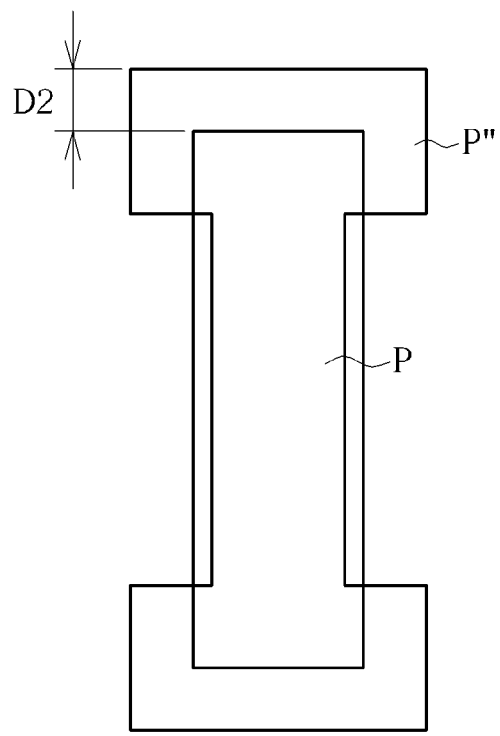

Please refer to FIG. 1 again, and refer to FIG. 3 and FIG. 4 together. The OPC calculations performed to the layout pattern 100 of the first region 102 and the layout pattern 100 of the second region 104 are explained as below. As shown in FIG. 3, a pattern P could be any strip pattern of the layout pattern 100 of the first region 102 or the second region 104, i.e. the pattern supposed to be formed on the photoresist layer on the wafer. A pattern P' is the corrected pattern corresponding to pattern P after the $N^{th}$ OPC calculation. Furthermore, as the pattern P is a pattern of the first region 102, an interval D1 between a side of the pattern P and a side of the pattern P' can be defined as an $N^{th}$ first correction value in the first region 102, in the other hand, as the pattern P is a pattern of the second region 104, the interval D1 can be defined as an $N^{th}$ second correction value in the second region 104. As shown in FIG. 4, a pattern P'' is the corrected pattern corresponding to the pattern P' after one more time OPC calculation, i.e. the pattern P'' is the corrected pattern corresponding to the pattern P after the $N+1^{th}$ OPC calculation. Furthermore, as the pattern P is a pattern of the first region 102, an interval D2 between the side of the pattern P and a side of the pattern P'' can be defined as a $N+1^{th}$ first correction value in the first region 102, in the other hand, as the pattern P is a pattern of the second region 104, the interval D2 can be defined as a $N+1^{th}$ second correction value in the second region 104. Moreover, the difference between the interval D1 and the interval D2 can be defined as a deviation value. In other words, the absolute value of a difference between the $N^{th}$ first correction value and the $N+1^{th}$ first correction value is defined as a $N^{th}$ first deviation value, and the absolute value of a difference between the $N^{th}$ second correction value and the $N+1^{th}$ second correction value is defined as a $N^{th}$ second deviation value, and N is a positive integer. In this exemplary embodiment, the first region 102 includes the geometric patterns P1 that are difficult to be corrected, and the second region 104 includes the geometric patterns P2 that are easy to be corrected, therefore, a rate of the convergence of the first correction value would be smaller than a rate of the convergence of the second correction value. Accordingly, when the first correction value converges, i.e. the first deviation value gets close to 0, the correction values (the first correction value and the second correction value) of the patterns have been converged, and the correction of the whole layout pattern 100 should have been completed, therefore, the OPC calculation can be ended. Additionally, an inspection step is required to check if the corrected layout pattern obeys the rules of the process rule check (PRC) in order to confirm the correctness of the corrected layout pattern. For example, through a simulation model, the corrected layout pattern is simulated to be transferred to the photoresist layer after performing an exposure process and a development process, and a line width of a transferred pattern of the corrected layout pattern is further compared to an original line width of a corresponding pattern of the original layout pattern 100, when the difference between the line width of the transferred pattern and the original line width of the corresponding pattern is smaller than a tolerance, the correctness of the corrected layout pattern can be confirmed. Therefore, the corrected layout pattern can be outputted through the computer system onto a mask, and the method of OPC is completed.

It is appreciated that, an additional determination step is used to modulate a total number of OPC calculations performed in the second region 104, therefore, a total number of OPC calculations performed in the first region 102 is substantially larger than the total number of OPC calculations performed in the second region 104. More specifically, when the $N^{th}$ first deviation value is substantially larger than the $N^{th}$ second deviation value, i.e. the convergence status of the corrected layout patterns of the first region 102 is worse than the convergence status of the corrected layout patterns of the second region 104, an $N+2^{th}$ OPC calculation may only be performed in the first region 102, and the $N+2^{th}$ OPC calculation may not be performed in the second region 104, accordingly, some OPC calculation time of the second region 104 can be saved, and the loading of the computer system can be lowered. Furthermore, the layout pattern of the second region 104 without the implementation of the $N+2^{th}$ OPC calculation can directly inherit the result of the $N+1^{th}$ OPC calculation, i.e. an $N+2^{th}$ second correction value may be directly equal to the $N+1^{th}$ second correction value. Furthermore, when the $N^{th}$ first deviation value is substantially smaller than or equal to the $N^{th}$ second deviation value, i.e. the convergence status of the corrected layout patterns of the first region 102 is similar to, or better than the convergence status of the corrected layout patterns of the second region 104, an $N+2^{th}$ OPC calculation may be performed in both of the first region 102 and the second region 104. As shown in Table. 1, since the $3^{rd}$ first deviation value (1.1) is substantially larger than the $3^{rd}$ second deviation value (0.1), the $5^{th}$ OPC calculation may only be performed to correct the layout pattern of the first region 102, and the layout pattern of the second region 104 may not be corrected during the $5^{th}$ OPC calculation. Moreover, the $5^{th}$ second correction value (15.4) may be directly equal to the $4^{th}$ second correction value (15.4). Similarly, because the $4^{th}$ or the $5^{th}$ first deviation value is substantially larger than the $4^{th}$ or the $5^{th}$ second deviation value, the $6^{th}$ or the $7^{th}$ OPC calculation may only be performed to correct the layout pattern of the first region 102, and may not be performed to correct the converged layout pattern in the second region 104.

TABLE 1

|  | The first region | | | The second region | | |
| --- | --- | --- | --- | --- | --- | --- |
| Iteration | The first correction value | The first deviation value | Calculation status | The second correction value | The second deviation value | Calculation status |
| 1 | 5.3 | 2.5 | V | 10.6 | 3.2 | V |
| 2 | 7.8 | 1.5 | V | 13.8 | 1.7 | V |
| 3 | 9.3 | 1.1 | V | 15.5 | 0.1 | V |
| 4 | 10.4 | 0.8 | V | 15.4 | 0 | V |
| 5 | 11.2 | 0.3 | V | 15.4 | 0 | X |
| 6 | 11.5 | 0.2 | V | 15.4 | 0 | X |
| 7 | 11.3 | — | V | 15.4 | — | X |

In other exemplary embodiments, several iterations of the OPC calculation performed in the second region 104 can be directly omitted without additional determination step; therefore, the total number of OPC calculations performed in the first region 102 is substantially larger than the total number of OPC calculations performed in the second region 104. The number of skipped OPC calculation can be evaluated by forming a test mask in advance. As shown in Table 2, the $2^{nd}$ OPC calculation, the $3^{rd}$ OPC calculation and the $7^{th}$ OPC calculation may only be performed to correct the layout pattern of the first region 102, and not be performed to correct the layout pattern of the second region 104.

TABLE 2

| Iteration | Calculation status | |
| --- | --- | --- |
| | The first region | The second region |
| 1 | V | V |
| 2 | V | X |
| 3 | V | X |
| 4 | V | V |
| 5 | V | V |
| 6 | V | V |
| 7 | V | X |

Figure 5:
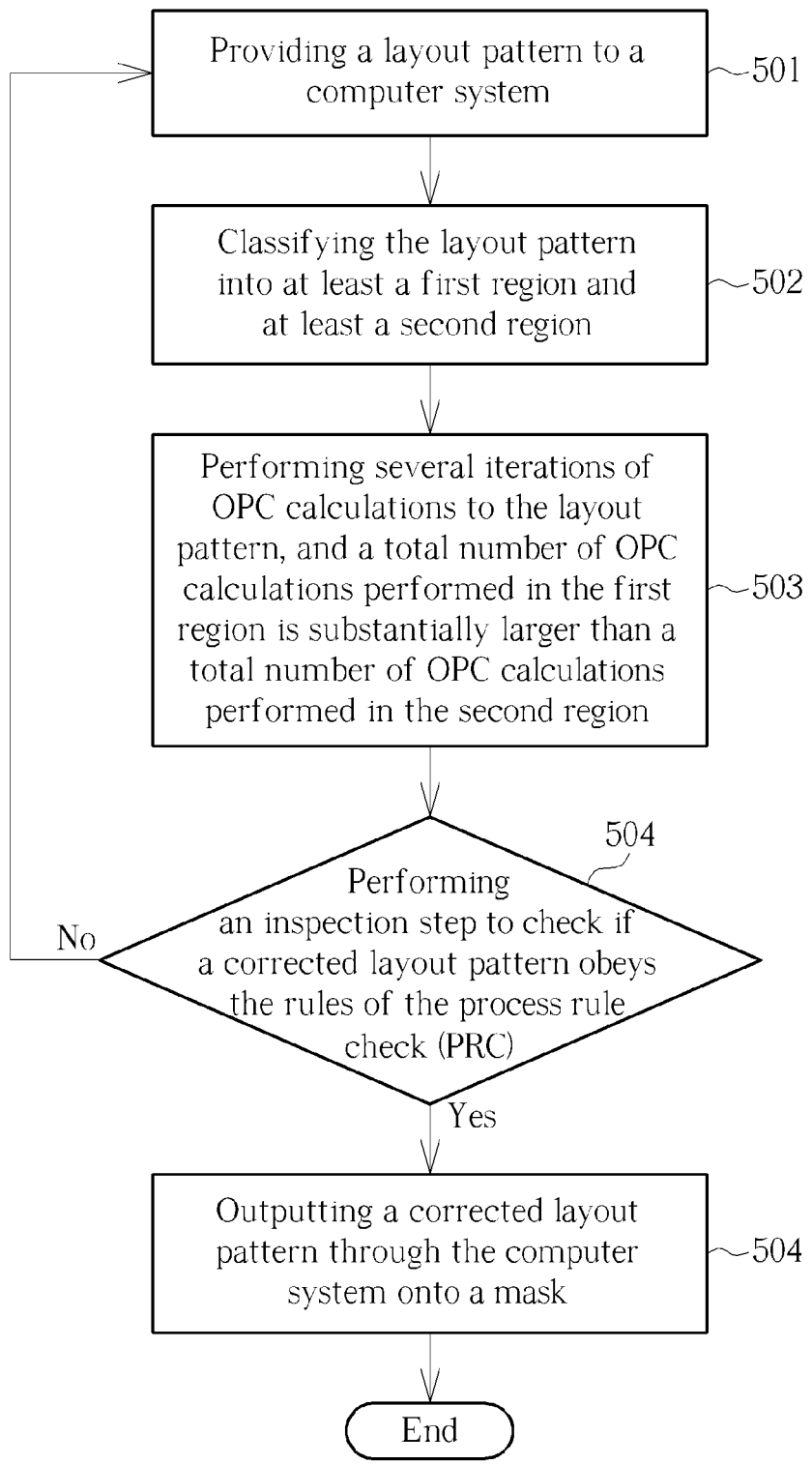
FIG. 5 is a flow chart illustrating a method of optical proximity correction (OPC) according to a preferred exemplary embodiment of the present invention.

To clarify the characteristic of the present invention, the flow chart is used to explain the method of optical proximity correction (OPC) of the present invention. Please refer to FIG. 5, FIG. 6, and refer to FIG. 1, Table. 1 and Table. 2 together. FIG. 5 is a flow chart illustrating a method of optical proximity correction (OPC) according to a preferred exemplary embodiment of the present invention. As shown in FIG. 5, a layout pattern is first provided to a computer system, as shown in step 501. Then, as shown in step 502, the layout pattern is classified into at least a first region and at least a second region, i.e. at least a dense region and at least an isolated region, or at least an easily-converged region and at least a hardly-converged region. Subsequently, as shown in step 503, several iterations of OPC calculations are performed to the layout pattern, and a total number of OPC calculations performed in the first region is substantially larger than a total number of OPC calculations performed in the second region. Furthermore, as shown in step 504, an inspection step is performed to check if a corrected layout pattern obeys the rules of the process rule check (PRC) in order to confirm the correctness of the corrected layout pattern. If yes, the corrected layout pattern can be outputted, otherwise, the corrected layout pattern may be provided to the computer system again, followed by the illustrated classification step and several iterations of OPC calculations, to be overall or partially modified. Finally, as shown in step 505, the corrected layout pattern is outputted through the computer system onto a mask.

Figure 6:
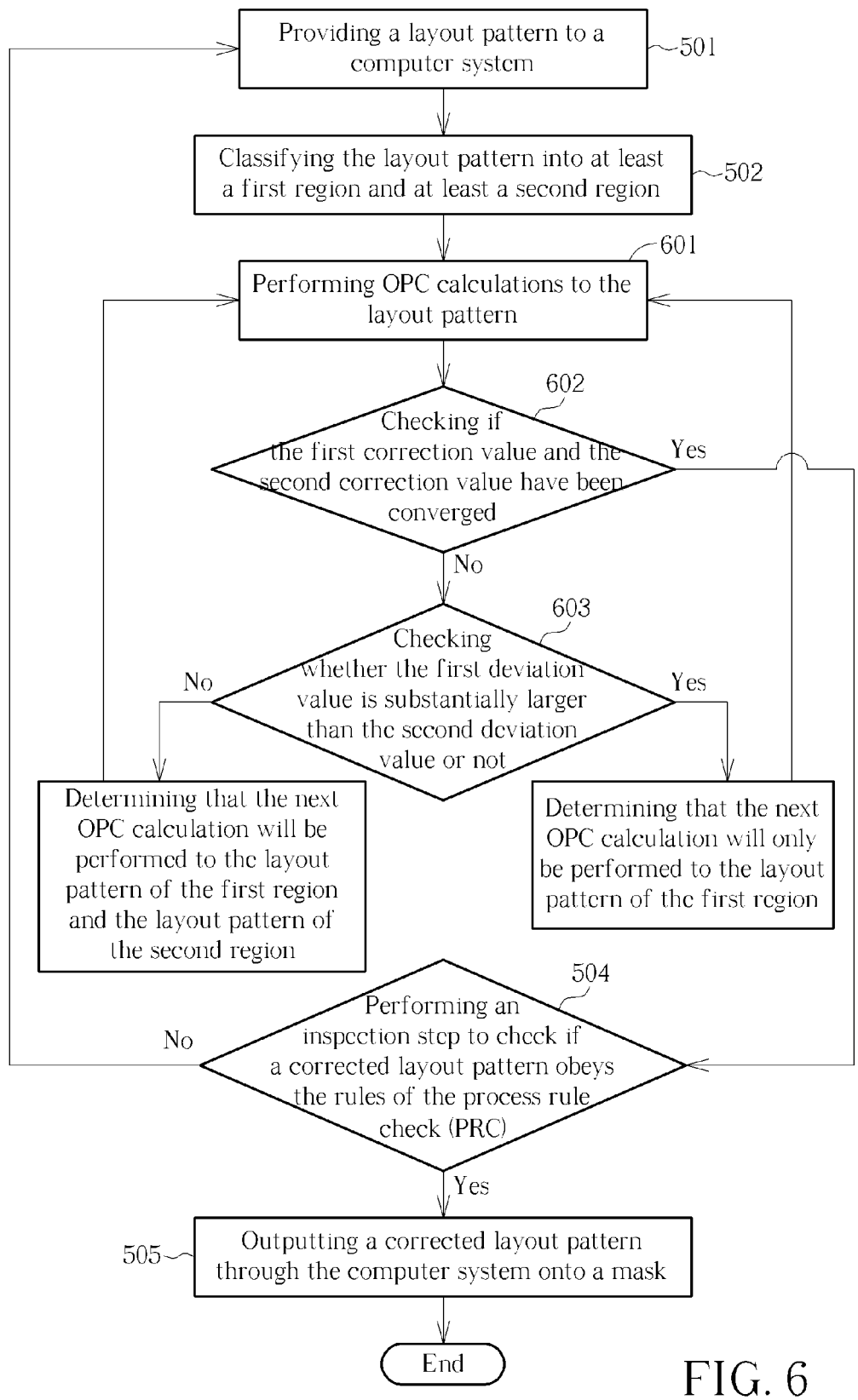
FIG. 6 is a flow chart illustrating a method of optical proximity correction (OPC) according to another preferred exemplary embodiment of the present invention.

FIG. 6 is a flow chart illustrating a method of optical proximity correction (OPC) according to another preferred exemplary embodiment of the present invention. As shown in FIG. 6, the present invention also includes a determination step to determine if OPC calculation is performed to the layout pattern of the second region. As shown in step 601, OPC calculations are performed to the layout pattern. As shown in step 602, if the first correction value and the second correction value have been converged is checked, if yes, the pattern correction is completed and the OPC calculation loop can be ended, otherwise, the determination step may be executed to determine which region the next OPC calculation will be performed on. In an exemplary embodiment, the criterion to judge the convergence could be that, if the first deviation value gets close to 0. Furthermore, as shown in step 603, the determination step, is used to check whether the first deviation value is substantially larger than the second deviation value or not, to determine which region the next OPC calculation will be performed on. The first deviation value of the first region and the second deviation value of the second region are calculated and compared, if the first deviation value is substantially smaller than or equal to the second deviation value, the next OPC calculation will be performed to the layout pattern of the first region and the layout pattern of the second region. Otherwise, when the first deviation value is substantially larger than the second deviation value, the next OPC calculation will only be performed to the layout pattern of the first region, and not be performed to the layout pattern of the second region.

In conclusion, the characteristics of the present invention are as illustrated below. The layout pattern may be first classified into the first region and the second region according to the pattern density, or the complexity of each of the patterns. The pattern density of the first region is high (or the patterns of the first region are hardly recognized), and the pattern density of the second region is low (or the patterns of the second region are easily recognized), therefore, the estimated time used to complete the correction of patterns of the first region would be longer than that used to complete the correction of patterns of the second region. Then, several iterations of OPC calculations are performed to the layout pattern, and at least one OPC calculation is only performed to the layout pattern of the first region and the correction of the layout pattern of the second region is skipped. Accordingly, the loading of computer system can be lowered, and the time to complete the correction of patterns can be shortened, moreover, if a portion of the mask pattern violates the rules of process rule check, the mask pattern could be partially re-modified, and the manufacturing cost of mask can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of optical proximity correction (OPC), comprising:

providing a layout pattern to a computer system, wherein the layout pattern comprises a plurality of geometric patterns, each of the geometric patterns has a judgment value, and the judgment value is positively corresponding to a value of mask error enhancement factor (MEEF), negatively corresponding to a value of normalized image log slope (NILS), and negatively corresponding to a value of contrast;

classifying the layout pattern into at least a first region and at least a second region, wherein each of the first region and the second region comprises a plurality of patterns, each pattern comprises at least one line segment, and a complexity of the layout pattern of the first region is substantially higher than a complexity of the layout pattern of the second region;

performing several iterations of OPC calculations to modify the original layout pattern, wherein a total number of OPC calculations performed in the first region is substantially larger than a total number of OPC calculations performed in the second region; and outputting a corrected layout pattern through the computer system onto a mask.

2. The method of OPC according to claim 1, wherein a method of classifying the layout pattern into the first region and the second region comprising:

first selecting a part of the layout pattern to be defined as the layout pattern of the first region; and defining the remaining layout pattern as the layout pattern of the second region.

3. The method of OPC according to claim 2, wherein a pattern density of the layout pattern of the first region is substantially larger than a pattern density of the layout pattern of the second region.

4. The method of OPC according to claim 1, further comprising:

defining each of the geometric patterns having the judgment value substantially larger than a cut-off value as a target pattern;

taking the target pattern as a reference point and selecting a specific region, wherein the geometric patterns contacted by the specific region are defined as the layout pattern of the first region; and defining the remaining layout pattern as the layout pattern of the second region.

5. The method of OPC according to claim 4, wherein the cut-off value corresponds to process conditions comprising a pattern density of the layout pattern, a type of light source, or a structure of light source.

6. The method of OPC according to claim 4, wherein the specific region is a circular region, a terminal of each of the target pattern serves as center, and a specific value is chosen as a radius value.

7. The method of OPC according to claim 6, wherein the specific value comprises 1 micrometer (μm).

8. The method of OPC according to claim 1, wherein a method of performing several iterations of OPC calculations comprises:

performing a $N^{th}$ OPC calculation and a $N+1^{th}$ OPC calculation in the first region to obtain an $N^{th}$ first correction value and an $N+1^{th}$ first correction value; and selectively performing the $N^{th}$ OPC calculation and the $N+1^{th}$ OPC calculation in the second region to obtain an $N^{th}$ second correction value and an $N+1^{th}$ second correction value.

9. The method of OPC according to claim 8, wherein an absolute value of a difference between the $N^{th}$ first correction value and the $N+1^{th}$ first correction value is defined as an $N^{th}$ first deviation value, and N is positive integer.

10. The method of OPC according to claim 9, wherein an absolute value of a difference between the $N^{th}$ second correction value and the $N+1^{th}$ second correction value is defined as an $N^{th}$ second deviation value, and N is positive integer.

11. The method of OPC according to claim 10, wherein when the $N^{th}$ first deviation value is substantially larger than the $N^{th}$ second deviation value, an $N+2^{th}$ OPC calculation is only performed in the first region, and not performed in the second region.

12. The method of OPC according to claim 11, wherein an $N+2^{th}$ second correction value is directly equal to the $N+1^{th}$ second correction value.

13. The method of OPC according to claim 10, wherein when the $N^{th}$ first deviation value is substantially smaller than or equal to the $N^{th}$ second deviation value, an $N+2^{th}$ OPC calculation is performed in both the first region and the second region.

14. The method of OPC according to claim 1, further comprising performing an inspection step to check if a corrected layout pattern obeys the rules of the process rule check (PRC) in order to confirm the correctness of the corrected layout pattern.

* * * * *